US012743998B2

(12) United States Patent
Peng et al.

(10) Patent No.: US 12,743,998 B2
(45) Date of Patent: Sep. 22, 2026

(54) DISPLAY MODULE AND DISPLAY DEVICE

(71) Applicant: Wuhan Tianma Microelectronics Co., Ltd., Wuhan (CN)

(72) Inventors: Chao Peng, Wuhan (CN); Chunmei Gao, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 19/314,275

(22) Filed: Aug. 29, 2025

(65) Prior Publication Data

US 2025/0391350 A1 Dec. 25, 2025

(30) Foreign Application Priority Data

Apr. 9, 2025 (CN) ........................ 202510439972.9

(51) Int. Cl.
*G09G 3/32* (2016.01)
*H10K 59/121* (2023.01)
*H10K 59/131* (2023.01)

(52) U.S. Cl.
CPC ............. *G09G 3/32* (2013.01); *H10K 59/121* (2023.02); *H10K 59/131* (2023.02);
(Continued)

(58) Field of Classification Search
CPC ............. G09G 3/32; G09G 2300/0465; G09G 2300/0842; G09G 2310/0267;
(Continued)

(56) References Cited

U.S. PATENT DOCUMENTS 12,277,901 B2 * 4/2025 Ma ....................... G09G 3/3208
2020/0058242 A1 * 2/2020 Liu .......................... G09G 3/20
(Continued)

FOREIGN PATENT DOCUMENTS

CN 105425486 A 3/2016
CN 113035844 A 6/2021
CN 116913927 A 10/2023

OTHER PUBLICATIONS

First Office Action (with English translation) received Nov. 1, 2025, issued in corresponding Chinese Application No. 202510439972.9, filed Apr. 9, 2025, 16 pages.

*Primary Examiner* — Andrew Sasinowski
(74) *Attorney, Agent, or Firm* — CHRISTENSEN O'CONNOR JOHNSON KINDNESS PLLC

(57) ABSTRACT

Provided are a display module and a display device. A non-display region of the display panel includes a first non-display region, a second non-display region and a third non-display region located between them and provided corresponding to a corner of the display region. The first non-display region and the display region are arranged along a first direction, and the second non-display region and the display region are arranged along a second direction. The display region includes first pixel rows and second pixel rows located on a side of the first pixel rows proximate the second non-display region. The first non-display region includes a gate driving circuit, which is connected to the first pixel rows through a first gate driving signal line. The non-display region includes a driver chip, which is connected to the second pixel rows through a second gate driving signal line.

17 Claims, 16 Drawing Sheets

(52) U.S. Cl.
CPC ............... *G09G 2300/0465* (2013.01); *G09G 2300/0842* (2013.01); *G09G 2310/0267* (2013.01); *G09G 2330/021* (2013.01); *G09G 2330/04* (2013.01)

(58) Field of Classification Search
CPC ......... G09G 2330/021; G09G 2330/04; G09G 3/20; G09G 3/2074; G09G 3/36; G09G 3/3674; H10K 59/121; H10K 59/131
See application file for complete search history.

(56) References Cited

U.S. PATENT DOCUMENTS

2020/0126470 A1* 4/2020 Gao ..................... G09G 3/2085
2022/0122547 A1* 4/2022 Yu ........................ G09G 3/3275
2023/0347741 A1* 11/2023 Wu ........................ B60K 35/22
2024/0072223 A1* 2/2024 Li ........................ H10D 86/441
2024/0122005 A1* 4/2024 Choi .................... G09G 3/3233
2024/0268164 A1* 8/2024 Bai ...................... G09G 3/3233

* cited by examiner

DISPLAY MODULE AND DISPLAY DEVICE

CROSS-REFERENCE TO RELATED APPLICATIONS

The present application claims priority to Chinese Patent Application No. 202510439972.9, filed on Apr. 9, 2025, the content of which is incorporated herein by reference in its entirety.

TECHNICAL FIELD

The present disclosure relates to the field of display technologies, and in particular, to a display module and a display device.

BACKGROUND

With continuous development of science and technology, an increasing number of display devices are widely used in people's daily life and work, and become an indispensable and important tool for people today. Moreover, with the continuous development of display technologies, consumers have increasingly higher requirements for appearance and size of display screens.

At present, the display panels have an issue of a relatively large frame width, especially for irregular display panels with non-rectangular shapes, the frame width is difficult to reduce.

SUMMARY

In view of this, embodiments of the present disclosure provide a display module and a display device for reducing a width of a third non-display region and improving a visual effect of the display module.

In a first aspect, an embodiment of the present disclosure provides a display module, including a display panel. The display panel includes a display region and a non-display region. The non-display region includes a first non-display region, a second non-display region and a third non-display region located between the first non-display region and the second non-display region. The first non-display region and the display region are arranged along a first direction, the second non-display region and the display region are arranged along a second direction, and the first direction intersects with the second direction. The third non-display region is provided corresponding to a corner of the display region. The display region includes a plurality of first pixel rows and a plurality of second pixel rows, the plurality of first pixel rows and the plurality of second pixel rows are arranged along the second direction, and the plurality of second pixel rows are located on a side of the plurality of first pixel rows proximate the second non-display region. The first non-display region includes a gate driving circuit, and one of the first pixel rows are electrically connected to the gate driving circuit through a first gate driving signal line. The non-display region includes a driver chip, and one of the second pixel rows are electrically connected to the driver chip through a second gate driving signal line.

In a second aspect, an embodiment of the present disclosure provides a display device including the display module.

According to the display module and the display device provided by the embodiments of the present disclosure, the second pixel row is electrically connected to the driver chip, so that the number of the gate driving circuits can be reduced or such circuits can even be completely eliminated from the third non-display region of the display panel, which is beneficial for reducing the width of the third non-display region of the display panel, and reducing the width difference between the third non-display region and the second non-display region, for example, the width of the third non-display region can be equal to the width of the second non-display region, and thus improving the visual effect of the display panel.

BRIEF DESCRIPTION OF DRAWINGS

In order to more clearly illustrate technical solutions of embodiments of the present disclosure, the accompanying drawings used in the embodiments are briefly described below. It should be noted that the accompanying drawings described below are merely some embodiments of the present disclosure, and other drawings may be obtained by those skilled in the art according to these drawings.

DESCRIPTION OF EMBODIMENTS

In order to better understand technical solutions of the present disclosure, embodiments of the present disclosure are described in detail below in conjunction with the drawings.

It should be noted that, the described embodiments are merely some rather than all of the embodiments of the present disclosure. Based on the embodiments of the present disclosure, all other embodiments obtained by those ordinary skilled in the art shall fall within the scope of the present disclosure.

Terms used in the embodiments of the present disclosure are only for the purpose of describing specific embodiments, and are not intended to limit the present disclosure. The terms "a/an", and "the/said" in a singular form in an embodiment of the present disclosure and the attached claims are also intended to include plural forms thereof, unless explicitly noted otherwise in the context.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects form an "or" relationship.

It should be understood that, although expressions "first", "second" are used to describe specific pixel rows, these specific pixel rows should not be limited to these terms. These terms are only used to distinguish various different pixel rows from one another. For example, without departing from the scope of the embodiments of the present disclosure, the first pixel row may also be referred to as a second pixel row, and similarly, the second pixel row may also be referred to as a first pixel row.

Figure 1:
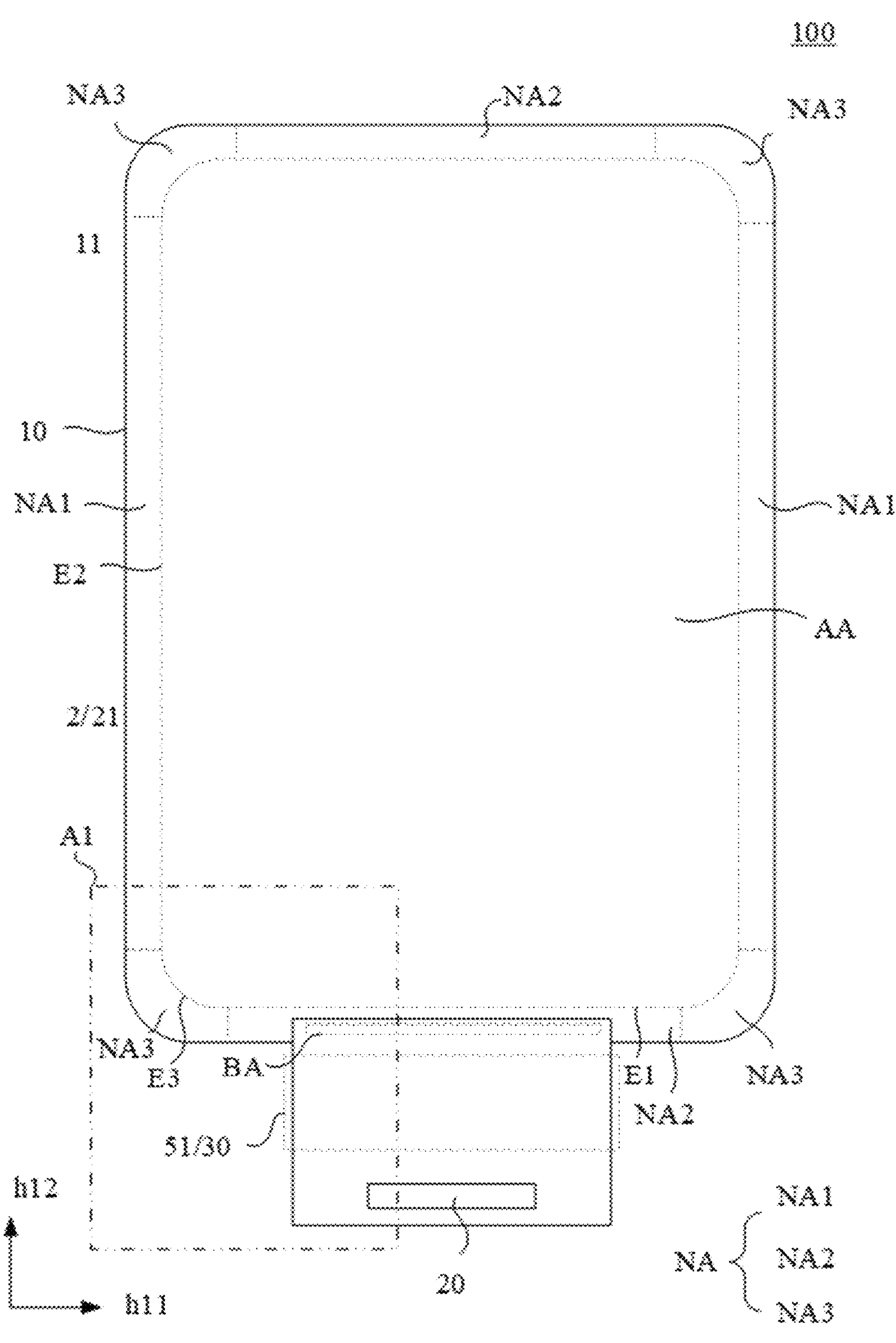
FIG. 1 is a schematic diagram of a display module according to an embodiment of the present disclosure.

An embodiment of the present disclosure provides a display module, as shown in FIG. 1, which is a schematic diagram of a display module according to an embodiment of the present disclosure, the display module 100 includes a display panel 10 and a driver chip 20. The driver chip 20 may be configured to provide various signals for display to the display panel 10. In some embodiments, such as is shown in FIG. 1, the display panel 10 includes a display region AA and a non-display region NA. The display region AA includes a plurality of sub-pixels (not shown in FIG. 1). The non-display region AA does not include sub-pixels.

In an embodiment of the present disclosure, a shape of the display region AA includes a polygon with rounded corners. FIG. 1 illustrates that the display region AA includes a rounded rectangle. As shown in FIG. 1, the display region AA includes a first edge E1 extending along the first direction h11 and a second edge E2 extending along the second direction h12. The first edge E1 and the second edge E2 are connected by a third edge E3. The third edge E3 includes an arc. That is, the third edge E3 is provided corresponding to a corner of the display region AA, and two edges having different extending directions of the display region AA are connected by the corner. The arc arrangement of the third edge E3 can make the display effect of the display region AA more aesthetic, thereby improving the visual effect of the display panel.

Figure 2:
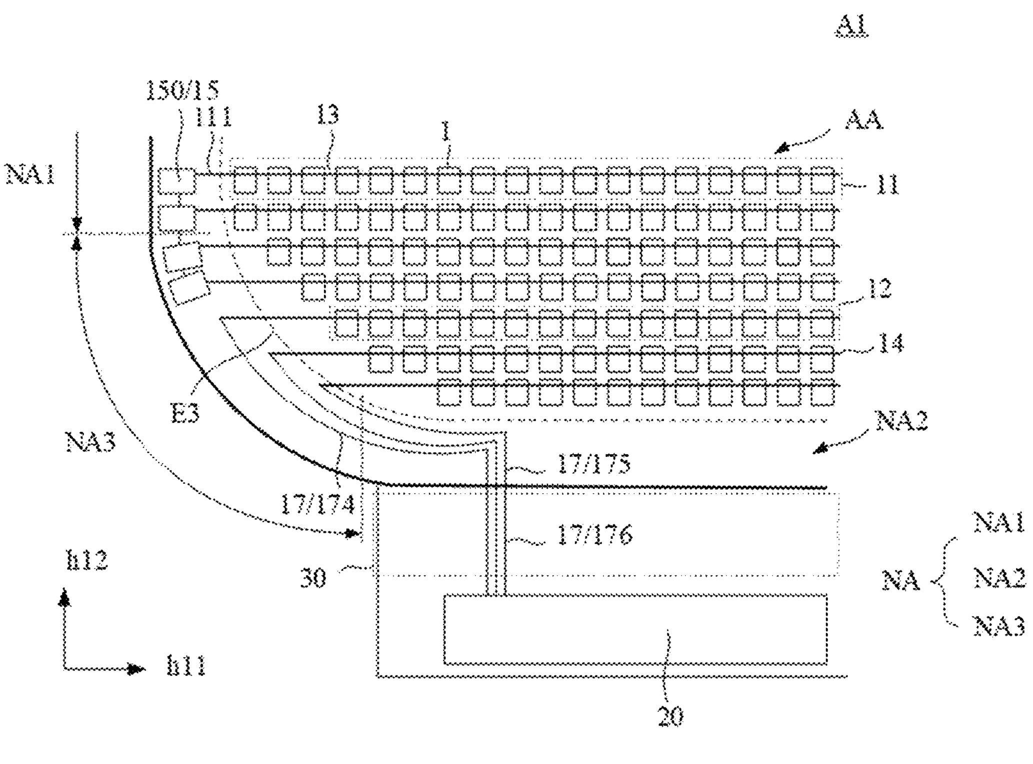
FIG. 2 is an enlarged schematic diagram of a region A1 in FIG. 1.

As shown in FIG. 1 and FIG. 2, FIG. 2 is an enlarged schematic diagram of a region A1 in FIG. 1. The display region AA includes a plurality of first pixel rows 11 and a plurality of second pixel rows 12. Each of the first pixel rows 11 includes sub-pixels 1 arranged along the first direction h11. Each of the second pixel rows 12 includes sub-pixels 1 arranged along the first direction h11.

As shown in FIG. 2, the first pixel rows 11 and the second pixel rows 12 are arranged along the second direction h12. Along the second direction h12, the second pixel rows 12 are located on a side of the first pixel rows 11 proximate the second non-display region NA2. Exemplarily, the first pixel row 11 includes m1 sub-pixels 1 arranged along the first direction h11, and the second pixel row 12 includes m2 sub-pixels 1 arranged along the first direction h11, both m1 and m2 are integers greater than 2. The first direction h11 intersects with the second direction h12. In an embodiment of the present disclosure, m2<m1. As shown in FIG. 2, along a direction from the display region AA to the second non-display region NA2, the sub-pixel located at an edge in the second pixel row 12 is retracted relative to the sub-pixel located at an edge in the first pixel row 11 towards a direction close to the inside of the display region AA. Based on this arrangement, the second pixel rows 12 each with a smaller number of sub-pixels may define the third edge E3 having the above arc shape, thereby optimizing the visual effect of the display panel. As shown in FIG. 2, at a position close to the third edge E3 of the display region AA, a plurality of sub-pixels 1 may be arranged in a stepped manner, so that an edge of the display region AA presents a visual effect with an arc edge in macroscopic vision.

In some embodiments, the display panel may include a plurality of second pixel rows 12, and the numbers of sub-pixels in different second pixel rows 12 may be the same or different, which is not limited in the embodiments of the present disclosure. FIG. 2 illustrates that the display panel 10 includes three second pixel rows 12, and the numbers of the three second pixel rows 12 are different from each other.

In some embodiments, such as is shown in FIG. 2, the display region AA further includes a first gate signal line 13 and a second gate signal line 14 both extending along the first direction h11. The first gate signal line 13 is electrically connected to the first pixel row 11 to provide a gate driving signal to the first pixel row 11, and the second gate signal line 14 is electrically connected to the second pixel row 12 to provide a gate driving signal to the second pixel row 12.

In some embodiments of the present disclosure, such as is as shown in FIG. 1 and FIG. 2, the non-display region NA includes a first non-display region NA1, a second non-display region NA2 and a third non-display region NA3. The first non-display region NA1 and the display region AA are arranged along the first direction h11. The second non-display region NA2 and the display region AA are arranged along the second direction h12. The third non-display region NA3 is located between the first non-display region NA1 and the second non-display region NA2, and the third non-display region NA3 is provided corresponding to a corner of the display region AA. In an embodiment of the present disclosure, the corner of the display region AA is rounded. As shown in FIG. 1, the first non-display region NA1 is located on a side of the first edge E1 away from the display region AA. The second non-display region NA2 is located on a side of the second edge E2 away from the display region AA. The third non-display region NA is located on a side of the third edge E3 away from the display region AA.

In some embodiments, such as is shown in FIG. 1 and FIG. 2, an edge of the third non-display region NA3 away from the display region AA includes an arc, an edge of the third non-display region NA3 close to the display region AA is also an arc, and the arc arrangement may optimize the visual effect of the display panel 10.

In some embodiments, such as is shown in FIG. 2, the first non-display region NA1 includes a gate driving circuit 15 configured to provide a gate driving signal to the first pixel row 11. As shown in FIG. 2, the display region AA may include a plurality of first pixel rows 11. Correspondingly, the gate driving circuit 15 includes a plurality of cascaded gate driving units 150, and the gate driving units 150 are electrically connected to the first pixel rows 11. When the display panel 10 is in operation, the plurality of gate driving units 150 provide gate driving signals step by step to sequentially turn on the plurality of first pixel rows 11.

In an embodiment of the present disclosure, as shown in FIG. 2, the second pixel row 12 is electrically connected to the driver chip 20. The gate driving signal required for the operation of the second pixel row 12 is not provided by the gate driving circuit 15, but by the driver chip 20.

When the display panel 10 is in operation, the gate driving circuit 15 and the driver chip 20 provide gate driving signals required for operation of the first pixel row 11 and the second pixel row 12, respectively. In an embodiment, the gate driving signal provided by the driver chip 20 may be after the last-stage gate driving unit 150 in the gate driving circuit 15 provides the gate driving signal. The gate driving signal refers to a signal provided to gates of at least some transistors in the first pixel row 11 and the second pixel row 12. The characteristics of the gate driving signal may be determined according to the specific structure of the sub-pixel 1.

Figure 3:
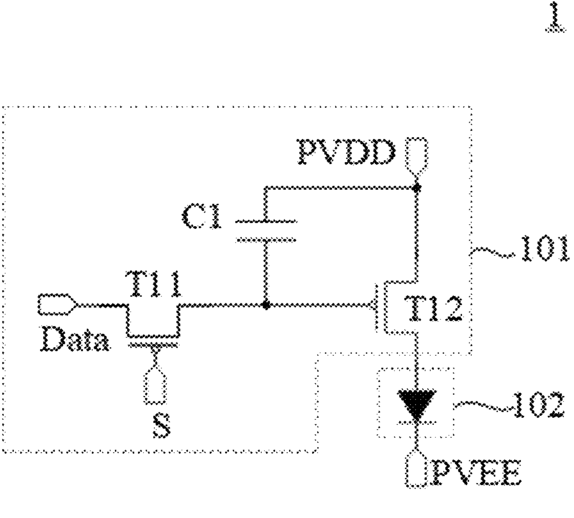
FIG. 3 is a schematic circuit diagram of a sub-pixel according to an embodiment of the present disclosure.

For example, with reference to FIG. 3, which is a schematic circuit diagram of a sub-pixel according to an embodiment of the present disclosure, and the sub-pixel 1 includes a pixel driving circuit 101 and a light-emitting element 102 that are electrically connected. The pixel driving circuit 101 includes a switching transistor T11, a driving transistor T12, and a storage capacitor C1. A gate of the switch transistor T11 is electrically connected to a scan signal terminal S, and a first terminal of the switch transistor T11 is electrically connected to a data voltage terminal Data. A second terminal of the switching transistor T11 is electrically connected to a gate of the driving transistor T12. A first terminal of the driving transistor T12 is electrically connected to a second power supply voltage terminal PVDD. A second terminal of the driving transistor T12 is electrically connected to the light-emitting element 102. The light-emitting element 102 is further electrically connected to a first power supply voltage terminal PVEE. Two plates of the storage capacitor C1 are electrically connected to the second power supply voltage terminal PVDD and the gate of the driving transistor T12, respectively.

When the pixel driving circuit 101 is designed as a "2T1C" structure including two transistors and one storage capacitor as shown in FIG. 3, the gate driving signal includes the scan signal received by the scan signal terminal S shown in FIG. 3. As shown in FIG. 2, the gate driving circuit 15 includes a scan driving circuit, which may provide the scan signal received by the scan signal terminal S shown in FIG. 3.

Figure 4:
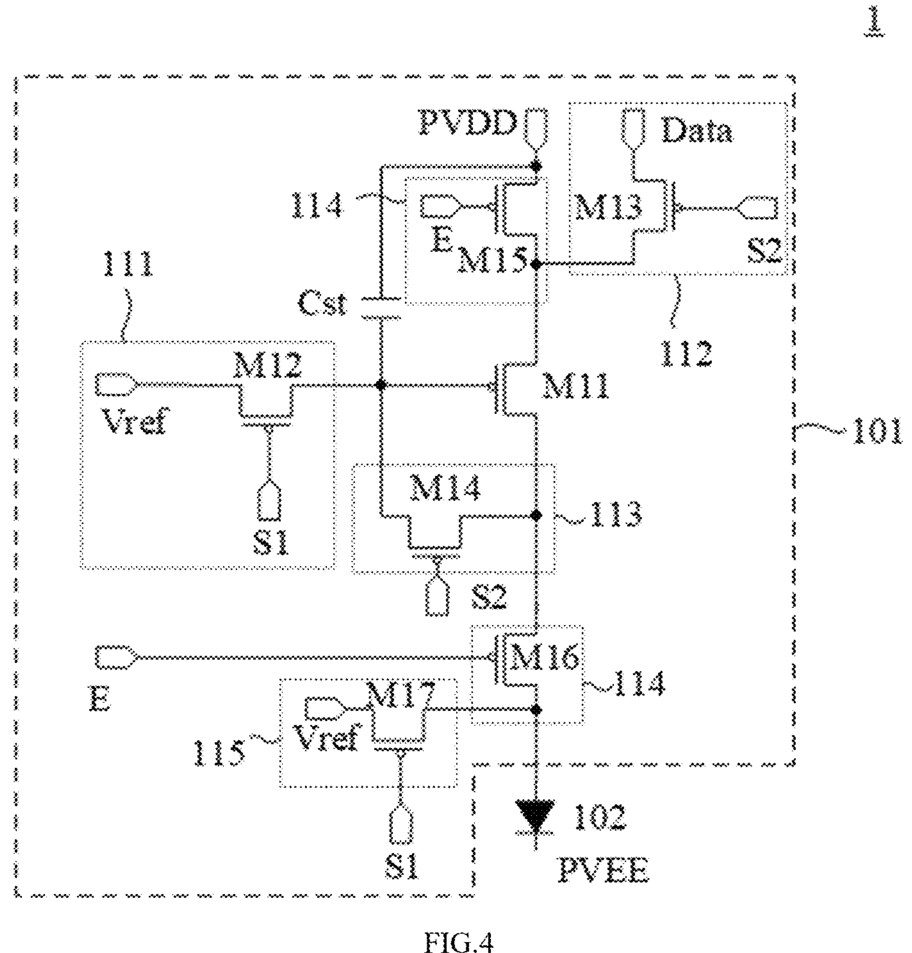
FIG. 4 is a schematic circuit diagram of another sub-pixel according to an embodiment of the present disclosure.

Alternatively, as shown in FIG. 4, which is a schematic circuit diagram of another sub-pixel according to an embodiment of the present disclosure, the pixel driving circuit 101 includes a storage capacitor Cst, a driving transistor M11, a first reset module 111, a data writing module 112, a threshold compensation module 113, a light-emitting control module 114 and a second reset module 115.

Two plates of the storage capacitor Cst are electrically connected to a second power supply voltage terminal PVDD and a gate of the driving transistor M11, respectively. The first reset sub-circuit 111 resets a potential of the gate of the driving transistor M11 in a reset period in response to a first scan signal. The data writing module 112 writes a data voltage to a first terminal of the driving transistor M11 during data writing and threshold compensation periods in response to a second scan signal. The threshold compensation module 113 compensates a threshold voltage of the driving transistor M11 during the data writing and threshold compensation periods. The second reset module 115 is configured to reset an electrode of the light-emitting element 102 during the reset period in response to the first scan signal. The light-emitting control module 114 controls the light-emitting element 102 to be lighted up during a light-emitting period in response to a light-emitting control signal.

In an embodiment, as shown in FIG. 4, the first reset circuit 111 includes a first reset transistor M12 having a gate electrically connected to a first scan signal terminal S1, and a first terminal and a second terminal electrically connected to a reset signal terminal Vref and the gate of the driving transistor M11, respectively. The data writing module 112 includes a data writing transistor M13 having a gate electrically connected to a second scan signal terminal S2, a first terminal and a second terminal electrically connected to a data signal terminal Data and the first terminal of the driving transistor M11, respectively. The threshold compensation module 113 includes a threshold compensation transistor M14 having a gate electrically connected to a second scan signal terminal S2, a first terminal electrically connected to a second terminal of the driving transistor M11, and a second electrode electrically connected to the gate of the driving transistor M11. The light-emitting control module 114 includes a first light-emitting control transistor M15 and a second light-emitting control transistor M16, both of which have gates electrically connected to a light-emitting control signal terminal E. A first terminal of the first light-emitting control transistor M15 is electrically connected to a second power supply voltage terminal PVDD, and a second terminal of the first light-emitting control transistor M15 is electrically connected to the first terminal of the driving transistor M11. A first terminal of the second light-emitting control transistor M16 is electrically connected to the second terminal of the driving transistor M11, and a second terminal of the second light-emitting control transistor M16 is electrically connected to a first electrode of the light-emitting element 102. The second reset module 115 includes a second reset transistor M17 having a gate electrically connected to the first scan signal terminal S1, a first terminal electrically connected to the reset signal terminal Vref, and a second terminal electrically connected to the first electrode of the light-emitting element 102. A second electrode of the light-emitting element 102 is electrically connected to a first power supply voltage terminal PVEE.

When the pixel driving circuit 101 is designed as a "7T1C" structure with seven transistors and one storage capacitor as shown in FIG. 4, the gate driving signal includes any one or more of a first scan signal received by the first scan signal terminal S1, a second scan signal received by the second scan signal terminal S2, and a light-emitting control signal received by the light-emitting control signal terminal E in the pixel driving circuit 101 as shown in FIG. 4.

Figure 5:
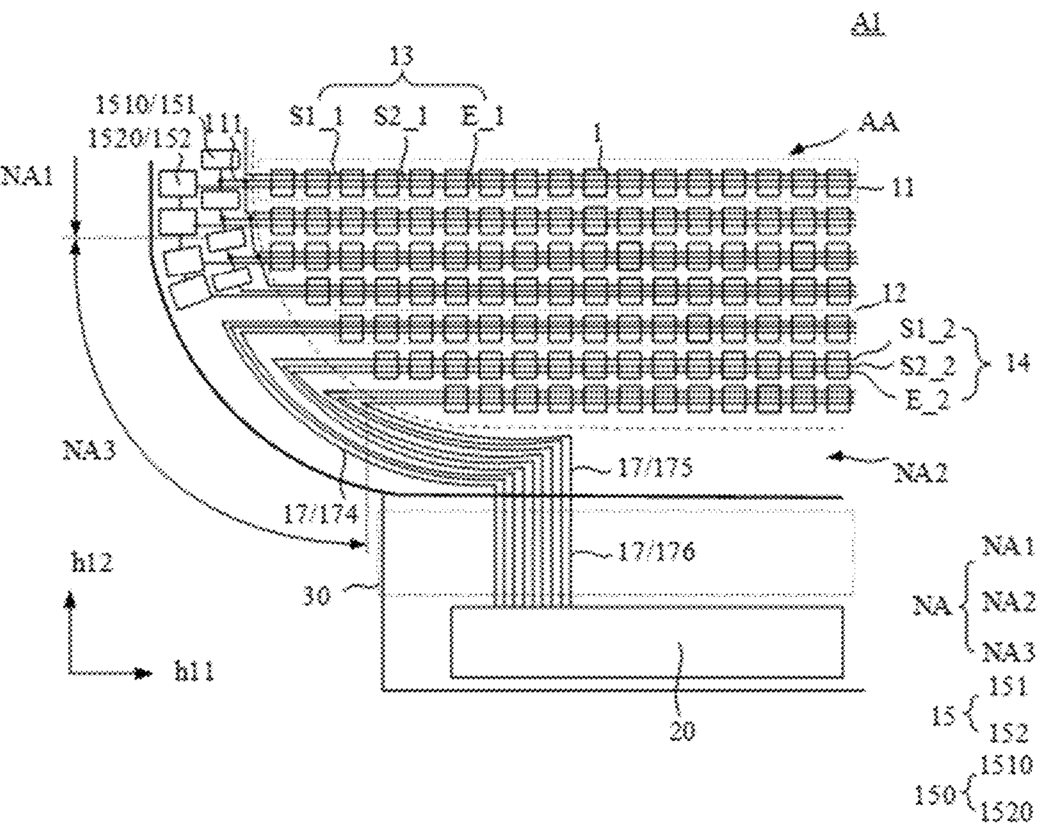
FIG. 5 is an enlarged schematic diagram of a region A1 in FIG. 1.

Correspondingly, as shown in FIG. 5, which is a schematic diagram of another display module according to an embodiment of the present disclosure, the first gate signal line 13 includes a first scan signal line S1_1, a second scan signal line S2_1 and a light-emitting control signal line E_1. The second gate signal line 14 includes a first scan signal line S1_2, a second scan signal line S2_2 and a light-emitting control signal line E_2. The first scan signal line S1_1 and the first scan signal line S1_2 transmit a first scan signal received by the first scan signal terminal S1 shown in FIG. 4. The second scan signal line S2_1 and the second scan signal line S2_2 transmit a second scan signal received by the second scan signal terminal S2 shown in FIG. 4. The light-emitting control signal line E_1 and the light-emitting control signal line E_2 transmit a light-emitting control signal received by the light-emitting control signal terminal E shown in FIG. 4.

In some embodiments, such as is shown in FIG. 5, the gate driving circuit 15 includes a scan driving circuit 151 and a light-emitting driving circuit 152. The scan driving circuit 151 includes a plurality of cascaded scan driving units 1510. The light-emitting driving circuit 152 includes a plurality of cascaded light-emitting driving units 1520. The gate driving unit 150 includes a scan driving unit 1510 and/or a light-emitting driving unit 1520.

In some embodiments, the scan driving unit 1510 may be electrically connected to the second scan signal line S2_1 which is connected to the current first pixel row 11, and the first scan signal line S1_1 which is electrically connected to the next first pixel row 11, to provide the first scan signal and the second scan signal to the first pixel row 11. The light-emitting driving unit 1520 is electrically connected to the light-emitting control signal line E_1 to provide the light-emitting control signal to the first pixel row 11.

As shown in FIG. 5, the driver chip 20 is electrically connected to the second pixel row 12, which means that the driver chip 20 is electrically connected to the first scan signal line S1_2, the second scan signal line S2_2 and the light-emitting control signal line E_2 respectively.

In the display module provided by the embodiments of the present disclosure, the second pixel row 12 receives the gate driving signal through the driver chip 20, so that the number of gate driving units 150 can be reduced or such units can even be completely eliminated from the third non-display region NA3, which is beneficial for reducing the frame width of the third non-display region NA3, and reducing the width difference between the third non-display region NA3 and the second non-display region NA2. For example, the width of the third non-display region NA3 can be equal to the width of the second non-display region NA2, and thus improving the visual effect of the display panel.

It should be noted that, when an edge of the third non-display region NA3 is set to be an arc, a width direction of the third non-display region NA3 at a certain position is a direction perpendicular to a tangent line of an edge at a corresponding position.

It should be understood that the structures of the pixel driving circuits 101 shown in FIG. 3 and FIG. 4 are merely illustrative, and a larger number of transistors may also be provided in the pixel driving circuit 101 according to different design requirements, which is not limited in the embodiments of the present disclosure. Of course, the display panel may further include a liquid crystal display panel, and the type of the display panel is not limited in the embodiments of the present disclosure.

In addition, it should be noted that the positional relationship between the scan driving circuit 151 and the light-emitting driving circuit 152 shown in FIG. 5 is merely an example, and positions of the scan driving circuit 151 and the light-emitting driving circuit 152 may be adjusted according to different design requirements in this or any embodiment of the present disclosure. For example, in embodiments of the present disclosure, along the first direction h11, the scan driving circuit 151 and the light-emitting driving circuit 152 may be respectively located on two sides of the display region AA, which is not limited in the embodiments of the present disclosure. In FIG. 5, one light-emitting driving unit 1520 is electrically connected to one first pixel row 11. In other implementations, one light-emitting driving unit 1520 may be electrically connected to two or more first pixel rows 11, so as to drive the two or more first pixel rows 11 with one light-emitting driving unit 1520, which is not limited in the embodiments of the present disclosure.

In some embodiments, a number n of the second pixel rows 12 satisfies: $3 \leq n \leq 10$. Based on this arrangement, it can avoid setting too many second pixel rows 12 electrically connected to the driver chip 20, and prevent the driver chip 20 from providing the gate driving signals to the too many pixel rows, which can reduce the design complexity of the driver chip 20. In addition, it can avoid setting too few second pixel rows 12 electrically connected to the driver chip 20, and avoid setting too many pixel rows to be provided with the gate driving signals through the gate driving circuit 15, thereby avoiding the gate driving circuit 15 from including too many gate driving units 150, avoiding the gate driving units 150 from occupying the space of the third non-display region NA3, and thus resulting in an increase of the width of the third non-display region NA3.

Figure 6:
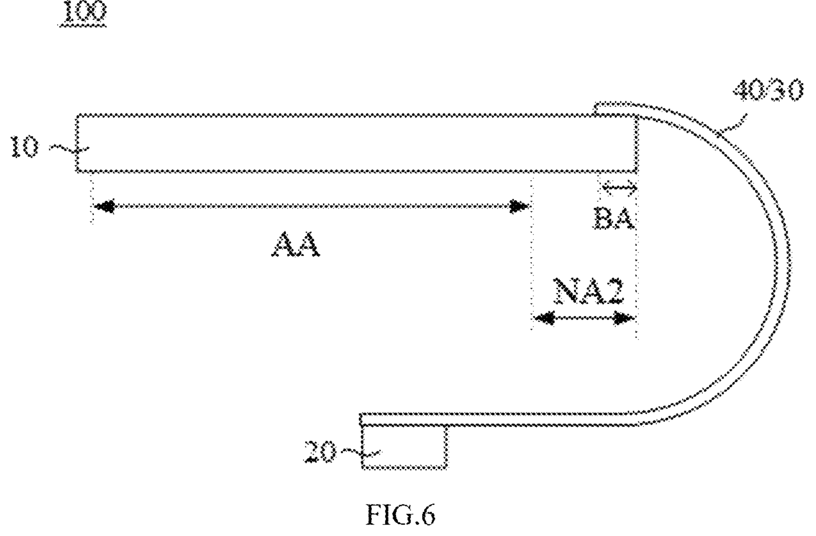
FIG. 6 is a schematic cross-sectional view of a display module in which a bent portion is in a bent state according to an embodiment of the present disclosure.

Exemplarily, with reference to FIG. 1, FIG. 2, FIG. 5, and FIG. 6, where FIG. 6 is a schematic cross-sectional view of a display module in which a bent portion is in a bent state according to an embodiment of the present disclosure, the display module 100 further includes a bent portion 30, which can be switched between an unfolded state and a bent state.

When the bent portion 30 is in the unfolded state, as shown in FIG. 1, FIG. 2 and FIG. 5, the bent portion 30 is located on a side of the driver chip 20 close to the display region AA. In an embodiment, the bent portion 30 is located on a side of the driver chip 20 proximate the second non-display region NA2.

In some embodiments, such as is shown in FIG. 1, when the shape of the display region AA is set to be a rounded rectangle, the display panel 10 may include at least two first non-display regions NA1 and at least two second non-display regions NA2. The two first non-display regions NA1 are oppositely provided on two sides of the display region AA along the first direction h11, and the two second non-display regions NA2 are oppositely provided on two sides of the display region AA along the second direction h12. Correspondingly, the display panel may include at least four third non-display regions NA3. As shown in FIG. 1, the bent portion 30 may be provided corresponding to one second non-display region NA2, that is, the driver chip 20 may be located on a side of one second non-display region NA2 away from the display region AA.

Figure 7:
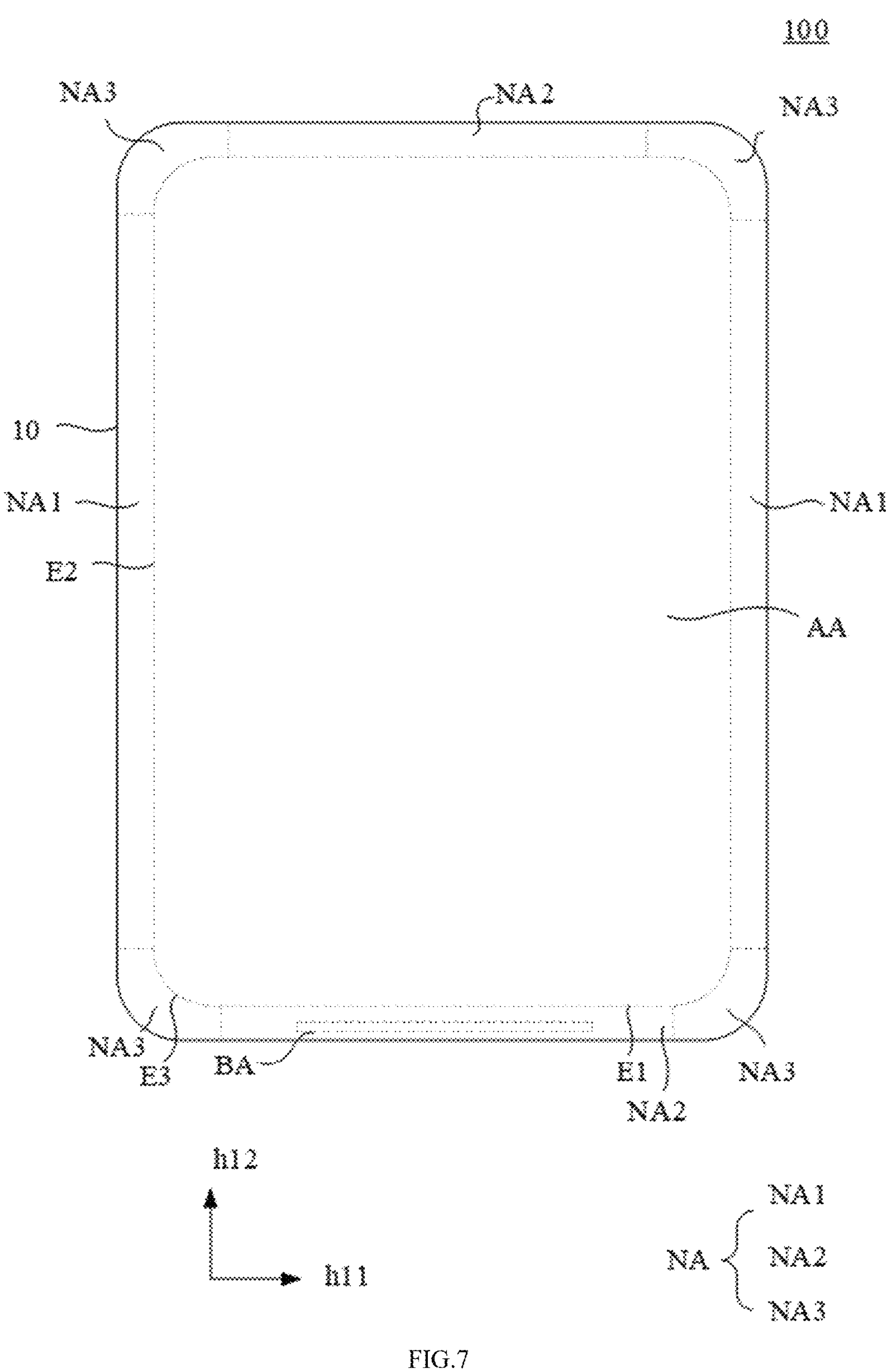
FIG. 7 is a schematic top view of the display module in which the bent portion is in a bent state shown in FIG. 1.

When the bent portion 30 is in the bent state, in an embodiment, as shown in FIG. 6 and FIG. 7, where FIG. 7 is a schematic top view of a display module 100 in which the bent portion 30 is in a bent state shown in FIG. 1, the driver chip 20 may be bent to a side of the display panel 10 away from a light-emitting side through the bent portion 30. The arrangement of the bent portion 30 can prevent the driver chip 20 from occupying the space at the light-emitting surface side of the display panel 10, which is beneficial to further reducing the frame width of the display panel 10 and improving the screen-to-body ratio of the display panel 10.

In some embodiments, the arrangement of the bent portion 30 may include various forms.

For example, as shown in FIG. 6, in an embodiment of the present disclosure, a flexible circuit board 40 may be provided in the display module 100, and the flexible circuit board 40 includes the bent portion 30. As shown in FIG. 6, the driver chip 20 is bonded to the flexible circuit board 40, and the second non-display region NA2 of the display panel 10 includes a bonding region BA. The bonding region BA includes a plurality of bonding terminals, and the flexible circuit board 40 is electrically connected to the bonding terminals.

As shown in FIG. 6, the driver chip 20 is mounted on the flexible circuit board 40, that is, the flexible circuit board 40 serves as a carrier of the driver chip 20. The driver chip 20 is electrically connected to the flexible circuit board 40. The flexible circuit board 40 on which the driver chip 20 is mounted may be referred to as a chip on film (COF). After bonding the COF to the display panel 10, in this embodiment of the present disclosure, the driver chip 20 may be bent to a side of the display panel 10 facing away from the light-emitting surface by bending the flexible circuit board 40, so as to improve the screen-to-body ratio of the display panel 10.

Figure 8:
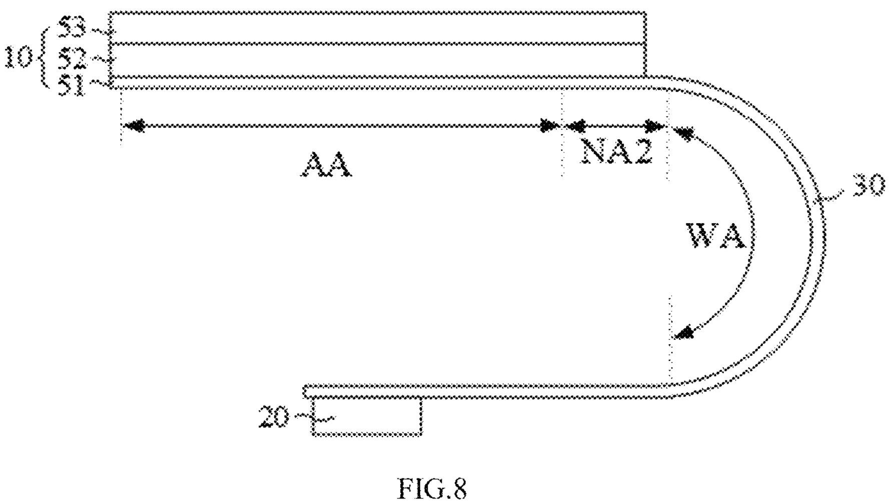
FIG. 8 is a schematic cross-sectional view of another display module in which a bent portion is in a bent state according to an embodiment of the present disclosure.

Alternatively, in another implementation, as shown in FIG. 8, which is a schematic cross-sectional view of another display module in which a bent portion is in a bent state according to an embodiment of the present disclosure, the display panel 10 includes a substrate 51, a driving functional layer 52 and a display functional layer 53 that are located on a side of the substrate 51, the driving functional layer 52 includes the pixel driving circuit, and the display functional layer 53 includes the light-emitting element.

In an embodiment of the present disclosure, the substrate 51 includes a flexible materials. For example, the flexible material includes polymer resins such as polyethersulfone (PES), polyacrylate, polyetherimide (PEI), polyethylene naphthalate (PEN), polyethylene terephthalate (PET), polyphenylene sulfide (PPS), polyarylester (PAR), polyimide (PI), polycarbonate (PC), or cellulose acetate propionate (CAP).

As shown in FIG. 8, in addition to the display region AA and the non-display region NA, the substrate 51 further includes a bent region WA, which is located between the driver chip 20 and the display region AA. In an embodiment, the bent region WA may be located between the driver chip 20 and the at least one second non-display region NA2, and the bent portion 30 includes the substrate 51 located in the bent region WA. In an embodiment of the present disclosure, the substrate 51 located in the bent region WA may be bent, so as to bend the driver chip 20 to a side of the display panel 10 away from the light-emitting side, thereby increasing the screen-to-body ratio of the display panel 10.

In some embodiments, such as is shown in FIG. 2 and FIG. 5, the display panel 10 further includes a first gate driving signal line 111 and a second gate driving signal line 17, and the first gate driving signal line 111 is electrically connected to the gate driving circuit 15 and the first pixel row 11. The second gate driving signal line 17 is electrically connected to the second pixel row 12 and the driver chip 20. The first gate driving signal line 111 is configured to provide a gate driving signal provided by the gate driving circuit 2 to the first pixel row 11. The second gate driving signal line 17 is configured to provide a gate driving signal provided by the driver chip 20 to the second pixel row 12.

As shown in FIG. 2 and FIG. 5, at least a portion of the first gate driving signal line 111 is located in the first non-display region NA1, and the first gate driving signal line 111 is electrically connected to the first gate signal line 13. The second gate driving signal line 17 is electrically connected to the second gate signal line 14.

Figure 9:
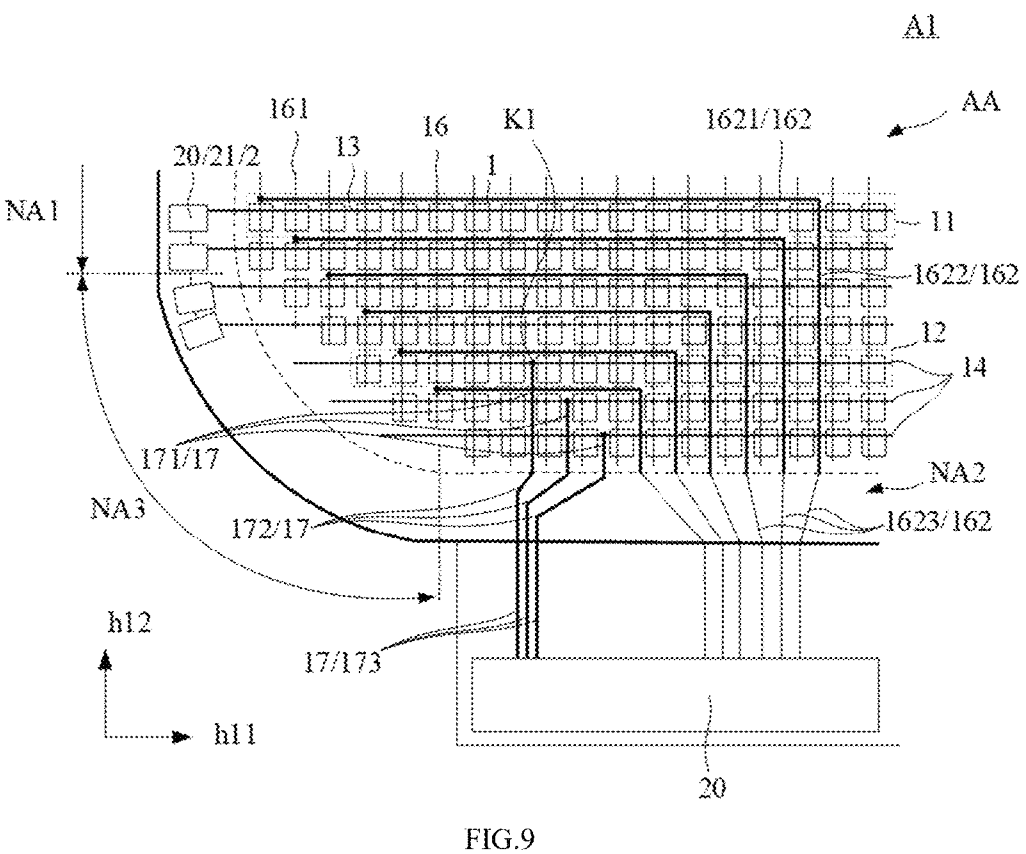
FIG. 9 is another enlarged schematic diagram of a region A1 in FIG. 1.

In some embodiments, such as is shown in FIG. 9, which is another enlarged schematic diagram of a region A1 in FIG. 1, at least a portion of the second gate driving signal line 17 is located in the display region AA. Compared with an arrangement of partially arranging the second gate driving signal line 17 in the third non-display region NA3, based on this arrangement, the number of traces and devices in the third non-display region NA3 can be further reduced, which is beneficial to further reducing the width of the third non-display region NA3.

When the second gate driving signal line 17 is provided, for example, as shown in FIG. 9, in an embodiment of the present disclosure, the second gate driving signal line 17 may include a first gate driving signal sub-line 171, a second gate driving signal sub-line 172 and a third gate driving signal sub-line 173 which are electrically connected. At least a portion of the first gate driving signal sub-line 171 is located in the display region AA. At least a portion of the second gate driving signal sub-line 172 is located in the second non-display region NA2. At least a portion of the third gate driving signal sub-line 173 is located in the second non-display region NA2.

Figure 10:
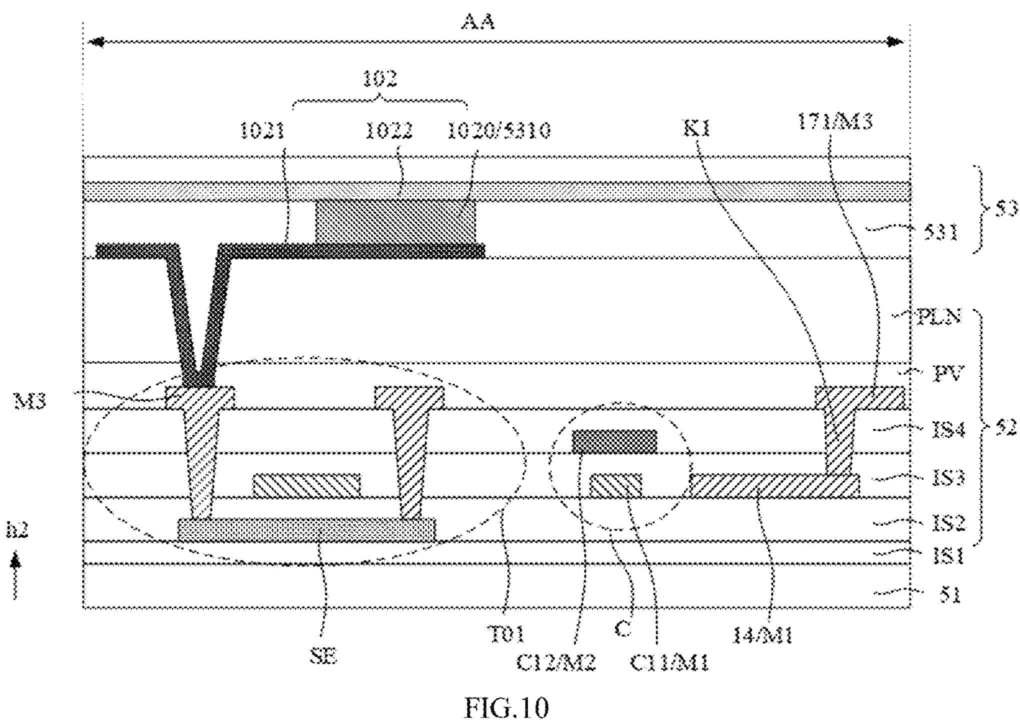
FIG. 10 is a schematic cross-sectional view of a display region of a display panel according to an embodiment of the present disclosure.

In an embodiment, as shown in FIG. 9, the first gate driving signal sub-line 171 may extend along the second direction h12. As shown in FIG. 10, which is a schematic cross-sectional view of a display region of a display panel according to an embodiment of the present disclosure, the first gate driving signal sub-line 171 and the second gate signal line 14 may be arranged in different layers, and the first gate driving signal sub-line 171 and the second gate driving signal sub-line 14 are electrically connected through a via K1 penetrating through an insulating layer located therebetween.

In some embodiments, such as is shown in FIG. 10, the display panel 10 includes a substrate 51, a driving functional layer 52 and a display functional layer 53 that are located on a side of the substrate 51. The display functional layer 53 is located on a side of the driving functional layer 52 away from the substrate 51.

The driving functional layer 52 includes a first insulating layer IS1, a semiconductor layer SE, a second insulating layer IS2, a first metal layer M1, a third insulating layer IS3, a second metal layer M2, a fourth insulating layer IS1, a third metal layer M2, a passivation layer PV and a planarization layer PLN which are sequentially stacked in a direction h2 away from the substrate 51. The semiconductor layer SE includes channels of at least some transistors in the pixel driving circuit 101. FIG. 10 only shows one transistor T01 electrically connected to the light-emitting element 102.

The first metal layer M1 includes gates of at least some transistors in the pixel driving circuit 101, a first plate C11 of a storage capacitor C in the pixel driving circuit 101, a first gate signal line, and a second gate signal line 14. The second metal layer M2 includes a second plate C12 of the storage capacitor C in the pixel driving circuit 101. The third metal layer M3 includes a first terminal and a second terminal of at least a portion of the transistors in the pixel driving circuit 101. The display functional layer 53 includes a pixel defining layer 531, a first electrode layer 1021, a second electrode layer 1022, and a light-emitting layer 1020. The pixel defining layer 531 includes a pixel opening 5310, and the light-emitting layer 1020 is at least partially located in the pixel opening 5310.

FIG. 10 takes the first gate driving signal sub-line 171 located in the third metal layer M3 and the second gate signal line 14 located in the first metal layer M1 as an illustration, and the first gate driving signal sub-line 171 and the second gate driving signal sub-line 14 are electrically connected through the via K1 penetrating through the fourth insulating layer IS4 and the third insulating layer IS3.

In an embodiment of the present disclosure, an extension line of the first gate driving signal sub-line 171 does not pass through the third non-display region NA3. In some embodiments, such as is shown in FIG. 9, an extension line of the first gate driving signal sub-line 171 passes through the second non-display region NA2. Based on this arrangement, it is beneficial to further reducing the width of the third non-display region NA3.

In some embodiments, such as is shown in FIG. 9, the display region AA further includes a plurality of data lines 16. The data lines 16 includes a first data line 161. An extension line of the first data line 161 passes through the third non-display region NA3. The display panel 10 further includes a data connection line 162 electrically connected to the first data line 161. The first data line 161 is electrically connected to the driver chip 20 through the data connection line 162. In an embodiment of the present disclosure, at least a portion of the data connection line 162 is located in the display region AA. Based on this arrangement, the data connection line 162 can be prevented from passing through the third non-display region NA3, thereby further reducing the number of traces in the third non-display region NA3, and thus further reducing the width of the third non-display region NA3.

Exemplarily, as shown in FIG. 9, the data connection line 162 includes a first data connection sub-line 1621 extending along the first direction h11 and a second data connection sub-line 1622 extending along the second direction h12. The first data connection sub-line 1621 and the second data connection sub-line 1622 are electrically connected, and both are at least partially located in the display region AA. The first data connection sub-line 1621 is intersected with and electrically connected to the first data line 161.

As shown in FIG. 9, the data connection line 162 further includes a third data connection sub-line 1623. At least a portion of the third data connection sub-line 1623 is located in the second non-display region NA2. The second data connection sub-line 1622 is electrically connected to the third data connection sub-line 1623.

In some embodiments, at least two of the first gate driving signal sub-line 171, the second data connection sub-line 1622 and the data line 16 are provided in a same layer. For example, in an embodiment of the present disclosure, the first gate driving signal sub-line 171 and the second data connection sub-line 1622 may be arranged in a same layer. Alternatively, the first gate driving signal sub-line 171 and the data line 16 may be arranged in a same layer. Alternatively, the second data connection sub-line 1622 and the data line 16 may be arranged in a same layer. Alternatively, the first gate driving signal sub-line 171, the second data connection sub-line 1622 and the data line 16 may be arranged in a same layer. Based on this arrangement, a number of film layers in the display panel can be reduced, thereby thinning the thickness of the display panel 10. Exemplarily, as shown in FIG. 11, which is a schematic cross-sectional view of a display region of another display panel according to an embodiment of the present disclosure, the first gate driving signal sub-line 171, the second data connection sub-line 1622 and the data line 16 may be provided in the third metal layer M3.

Figure 11:
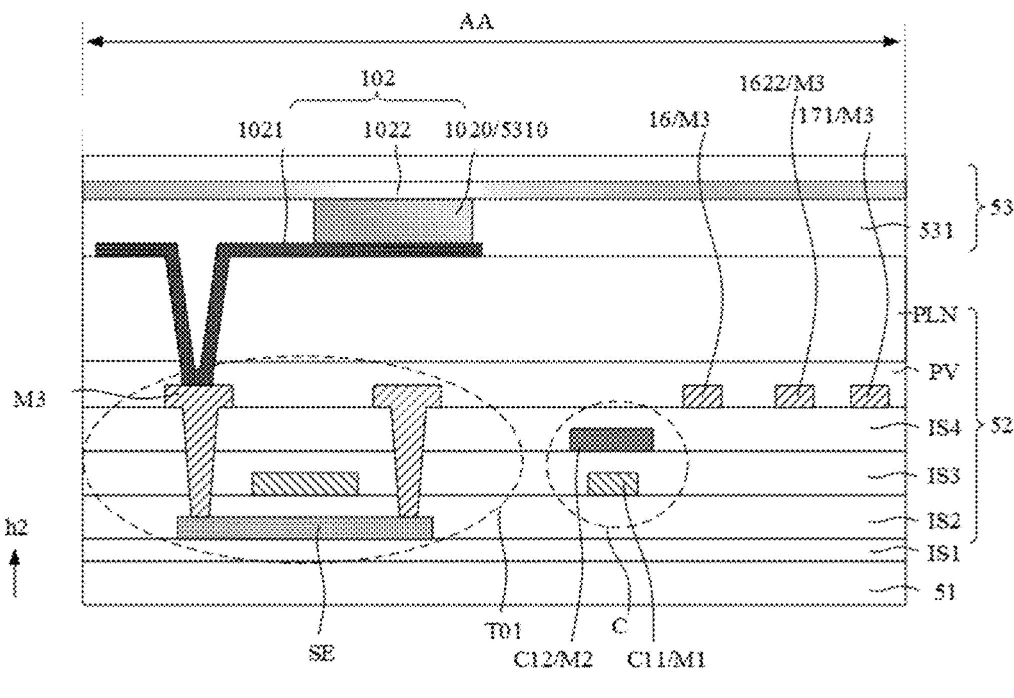
FIG. 11 is a schematic cross-sectional view of a display region of another display panel according to an embodiment of the present disclosure.

It should be noted that the film layer structures shown in FIG. 10 and FIG. 11 are merely for illustration, and in an embodiment of the present disclosure, a fourth metal layer located on a side of the third metal layer M3 away from the substrate 51 may also be provided in the driving functional layer 52, and at least two of the first gate driving signal sub-line 171, the second data connection sub-line 1622, and the data line 16 are provided in the fourth metal layer. Based on this arrangement, a number of structures in the third metal layer M3 may be reduced, thereby reducing the wiring difficulty.

In another implementable manner, for example, as shown in FIG. 2 and FIG. 5, in an embodiment of the present disclosure, at least a portion of the second gate driving signal line 17 may be located in the non-display region NA. For example, in an embodiment of the present disclosure, at least a portion of the second gate driving signal line 17 may be located in the third non-display region NA3.

As shown in FIG. 2 and FIG. 5, an end portion of the second gate signal line 14 extends to the third non-display region NA3, and is electrically connected to the second gate driving signal line 17. With this arrangement, the second gate driving signal line 17 is prevented from being arranged in the display region AA, thereby reducing the wiring difficulty of the display region AA.

In an embodiment, as shown in FIG. 2 and FIG. 5, the second gate driving signal line 17 includes a first connection sub-line 174, a second connection sub-line 175, and a third connection sub-line 176 that are electrically connected, and extending directions of the first connection sub-line 174, the second connection sub-line 175, and the third connection sub-line 176 intersect. At least a portion of the first connection sub-line 174 is located in the third non-display region NA3, at least a portion of the second connection sub-line 175 is located in the second non-display region NA2, and at least a portion of the third connection sub-line 176 is located in the bent portion 30.

In an embodiment of the present disclosure, an included angle between the second direction h12 and the extending direction of the first connection sub-line 174 at least some positions is less than or equal to 45°. Based on this arrangement, a length of a component of the first connection sub-line 174 in the first direction h11 can be reduced, and when the display panel 10 includes a plurality of first connection sub-lines 174, it is beneficial to reducing the total area occupied by first connection sub-lines 174 in the first direction h11, thereby reducing the width of the third non-display region NA3 in the first direction h11.

It should be noted that the first connection sub-line 174 may be a straight line or a curve. When the first connection sub-line 174 is set as a curve, the extending direction of the first connection sub-line 174 at a certain position refers to an extending direction of a tangent line of the first connection sub-line 324 at this position.

Figure 12:
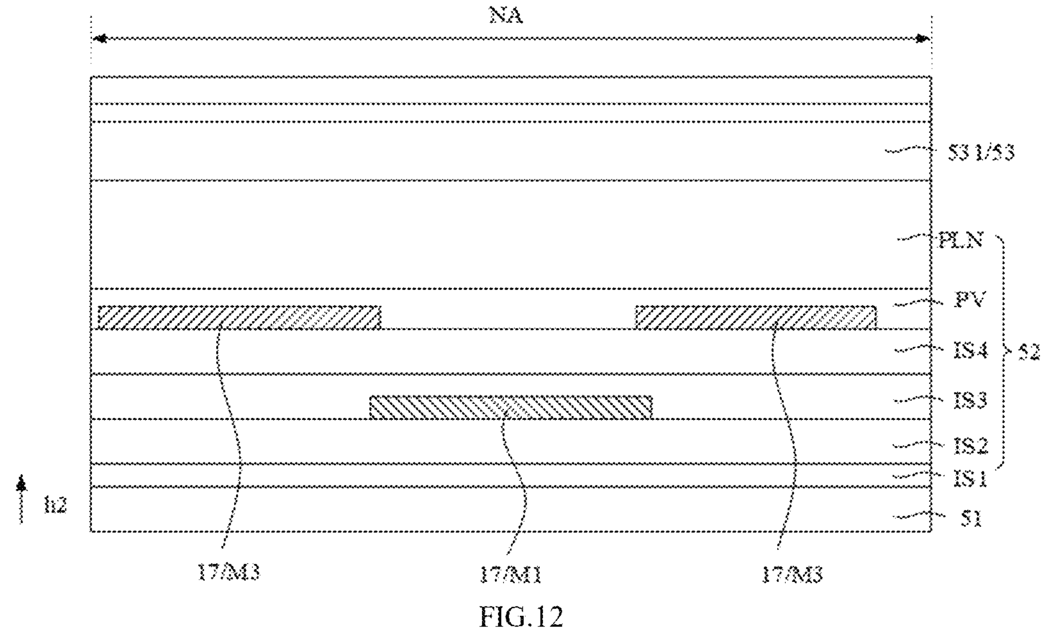
FIG. 12 is a schematic cross-sectional view of a non-display region of a display panel according to an embodiment of the present disclosure.

Exemplarily, in the embodiments of the present disclosure, two adjacent second gate driving signal lines 17 may be located in different film layers. For example, two adjacent second gate driving signal lines 17 may be alternately located in any two of the first metal layer, the second metal layer and the third metal layer. As shown in FIG. 12, which is a schematic cross-sectional view of a non-display region of a display panel according to an embodiment of the present disclosure, one of two adjacent second gate driving signal lines 17 is located in the first metal layer M1, and the other one is located in the third metal layer M3. Based on this arrangement, a distance between two adjacent second gate driving signal lines 17 can be reduced, which is beneficial to further reducing a width of the non-display region NA of the second gate driving signal lines 17. For example, two adjacent second gate driving signal lines 17 may at least partially overlap in a direction h2 perpendicular to a plane of the substrate 51.

In some embodiments, two adjacent second gate driving signal lines 17 being located in different film layers includes at least one of the following three cases: two adjacent first connection sub-lines 174 being located in different film layers, two adjacent second connection sub-lines 175 being located in different film layers, and two adjacent third connection sub-lines 176 being located in different film layers.

Figure 13:
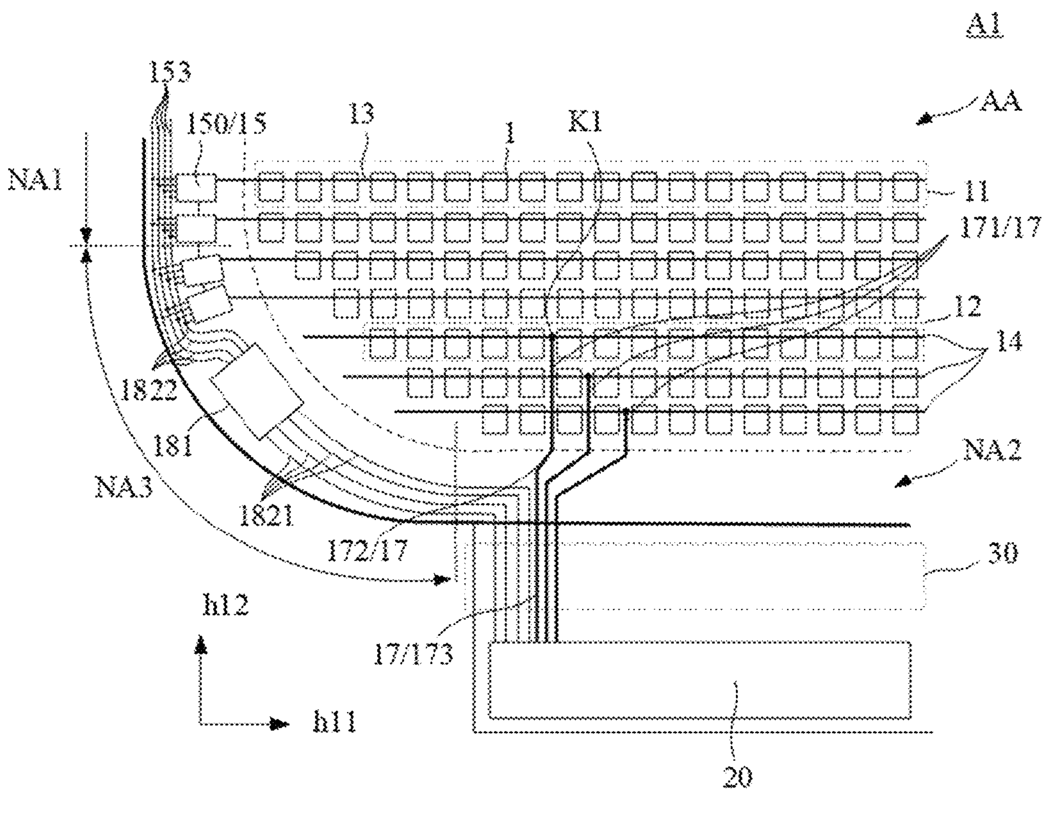
FIG. 13 is another enlarged schematic diagram of a region A1 in FIG. 1.
Figure 14:
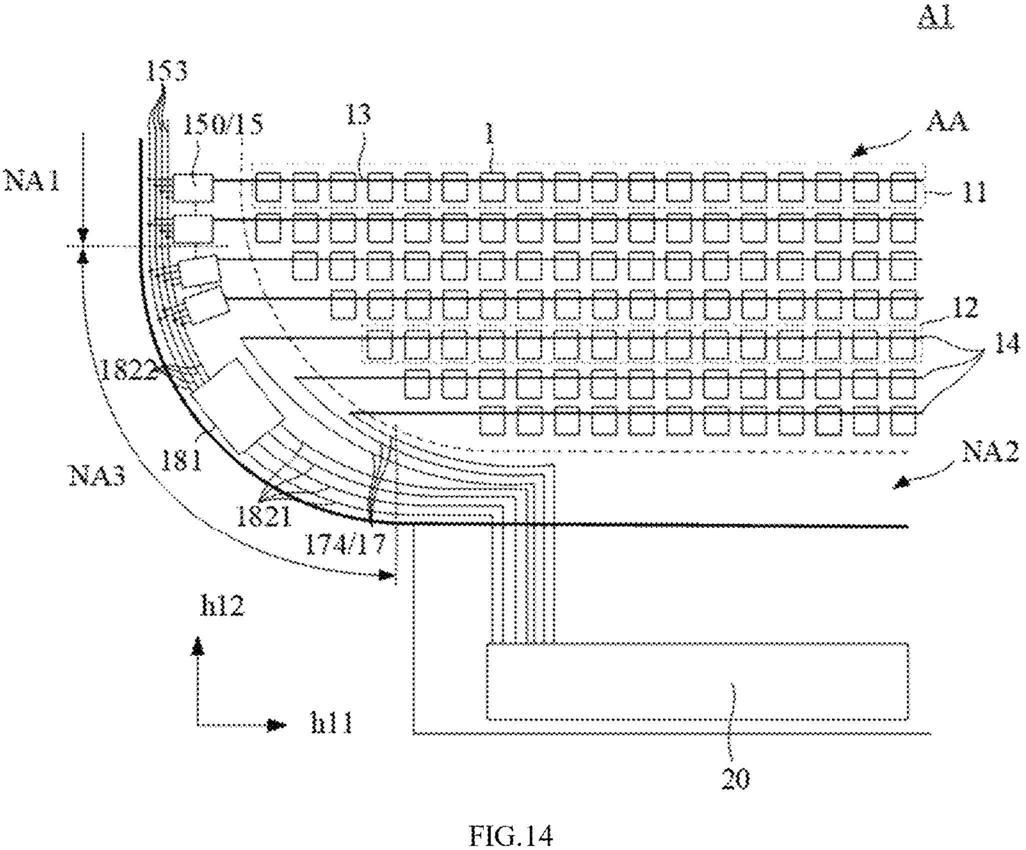
FIG. 14 is another enlarged schematic diagram of a region A1 in FIG. 1.

In some embodiments, such as is shown in FIG. 13 and FIG. 14, where FIG. 13 and FIG. 14 are two other enlarged schematic diagrams of a region A1 in FIG. 1, the third non-display region NA3 includes an electrostatic discharge protection circuit 181. The electrostatic discharge protection circuit 181 can improve the anti-electrostatic capability of the display panel 10, thereby avoiding the electrostatic damage to the electronic structure in the display region AA.

In some embodiments, such as is shown in FIG. 13, at least a portion of the second gate driving signal line 17 may be located in the display region AA. Alternatively, as shown in FIG. 14, at least a portion of the second gate driving signal line 17 may be located in the third non-display region NA3.

As shown in FIG. 14, when at least a portion of the second gate driving signal line 17 is located in the third non-display region NA3, at least a portion of the electrostatic discharge protection circuit 181 may be located on a side of the second gate driving signal line 17 away from the display region AA. That is, the electrostatic discharge protection circuit 181 is located outside the second gate driving signal line 17. Based on this arrangement, the second gate driving signal line 17 may be protected from the electrostatic damage by the electrostatic discharge protection circuit 181.

In some embodiments, such as is shown in FIG. 13 and FIG. 14, the display panel 10 further includes a gate driving input signal line 153 electrically connected to the gate driving unit 150. The gate driving input signal line 153 is configured to transmit a driving signal for driving the gate driving unit 150 to be in operation. For example, the driving signal includes one or more of a first level signal VGH, a second level signal VGL, a first clock signal CK, and a second clock signal XCK.

In an embodiment of the present disclosure, as shown in FIG. 13 and FIG. 14, the driver chip 20 and the gate driving input signal line 153 are electrically connected through the electrostatic discharge protection circuit 181. The driving signal required for the operation of the gate driving unit 150 is received from the driver chip 20 through the electrostatic discharge protection circuit 181. Based on this arrangement, the driving signal required for the operation of the gate driving unit 150 can be input into each stage of the gate driving unit 150 after being subjected to the anti-electrostatic treatment of the electrostatic discharge protection circuit 181, thereby facilitating reducing the risk of the corresponding gate driving input signal line 153 being electrostatically damaged, and thus facilitating improving the reliability of the gate driving input signal line 153.

In some embodiments, such as is shown in FIG. 13 and FIG. 14, the third non-display region NA3 further includes a first electrostatic discharge protection connection line 1821 electrically connecting the driver chip 20 and the electrostatic discharge protection circuit 181. In an embodiment, a signal transmitted by the first electrostatic discharge protection connection line 1821 is the driving signal. As shown in FIG. 13 and FIG. 14, the electrostatic discharge protection circuit 181 and the driver chip 20 are connected by four first electrostatic discharge protection connection lines 1821, which respectively transmit the first level signal VGH, the second level signal VGL, the first clock signal CK and the second clock signal XCK. The gate driving unit 150 and the electrostatic discharge protection circuit 181 are connected by four second electrostatic discharge protection connection lines 1822, which respectively transmit the first level signal VGH, the second level signal VGL, the first clock signal CK and the second clock signal XCK.

In an embodiment, as shown in FIG. 14, at least a portion of the second gate driving signal line 17 is located in the third non-display region NA3. As shown in FIG. 14, the third non-display region NA3 includes the first connection sub-line 174.

When the traces in the third non-display region NA3 are provided, for example, as shown in FIG. 14, at least a portion of the first electrostatic discharge protection connection line 1821 may be located on a side of the second gate driving signal line 17 away from the display region AA. That is, the first electrostatic discharge protection connection line 1821 is provided outside the second gate driving signal line 17. With this arrangement, the first electrostatic discharge protection connection line 1821 can be used to protect the second gate driving signal line 17 from being electrostatically damaged, which is beneficial to improving the stability of the second gate driving signal line 17, thereby ensuring accurate display of the display panel 10.

Figure 15:
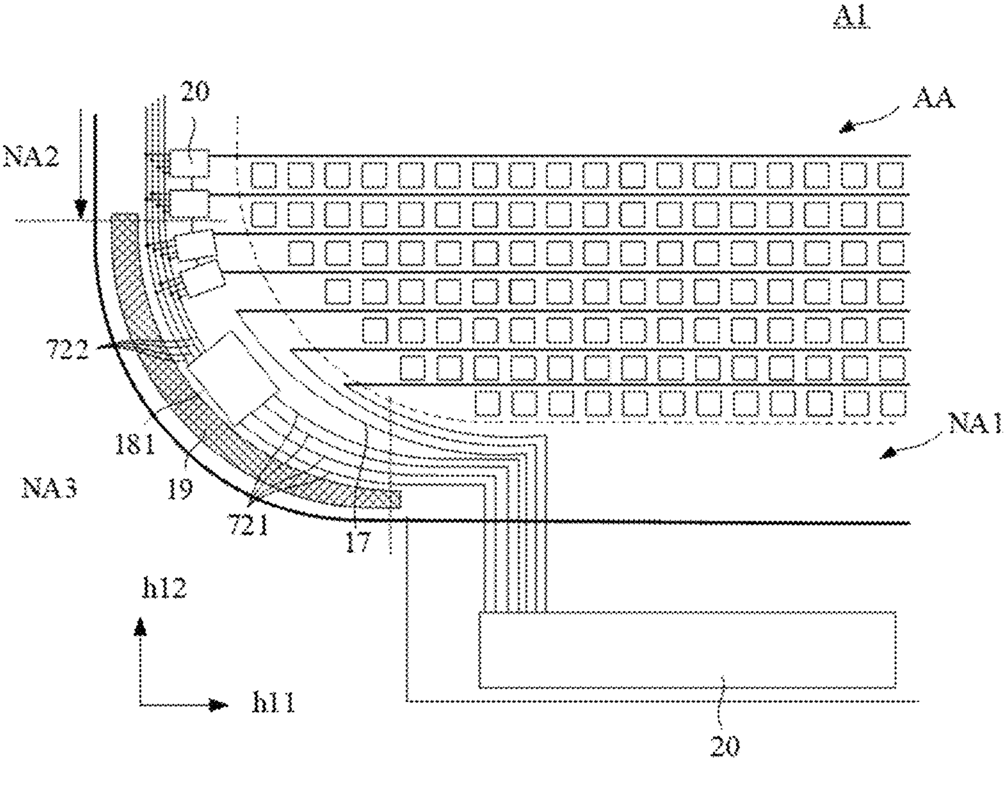
FIG. 15 is another enlarged schematic diagram of a region A1 in FIG. 1.

In some embodiments, such as is shown in FIG. 15, which is another enlarged schematic diagram of a region A1 in FIG. 1, the third non-display region NA3 further includes a first power connection line 19, which is electrically connected to the first pixel row 11 and the second pixel row 12 in the display region AA. The first power connection line 19 may provide the first power voltage PVEE shown in FIG. 3 or FIG. 4 to the first pixel row 11 and the second pixel row 12.

As shown in FIG. 15, the first power connection line 19 is located on a side of the electrostatic discharge protection circuit 181 away from the display region AA. In some embodiments, such as is shown in FIG. 15, a width of the first power connection line 19 is greater than a width of the second gate driving signal line 17, so as to reduce a resistance of the first power connection line 19 and reduce a voltage drop of the first power voltage PVEE during transmission. The first power connection line 19 transmits a constant signal and has a larger line width. Compared with the second gate driving signal line 17, the first power connection line 19 has relatively strong anti-electrostatic damage. In an embodiment of the present disclosure, the first power connection line 19 is located on a side of the electrostatic discharge protection circuit 181 away from the display region AA, and the first power connection line 19 can be configured to protect the second gate driving signal line 17 from electrostatic damage, which is beneficial to further improving the stability of the second gate driving signal line 17, thereby ensuring accurate display of the display panel 10.

Figure 16:
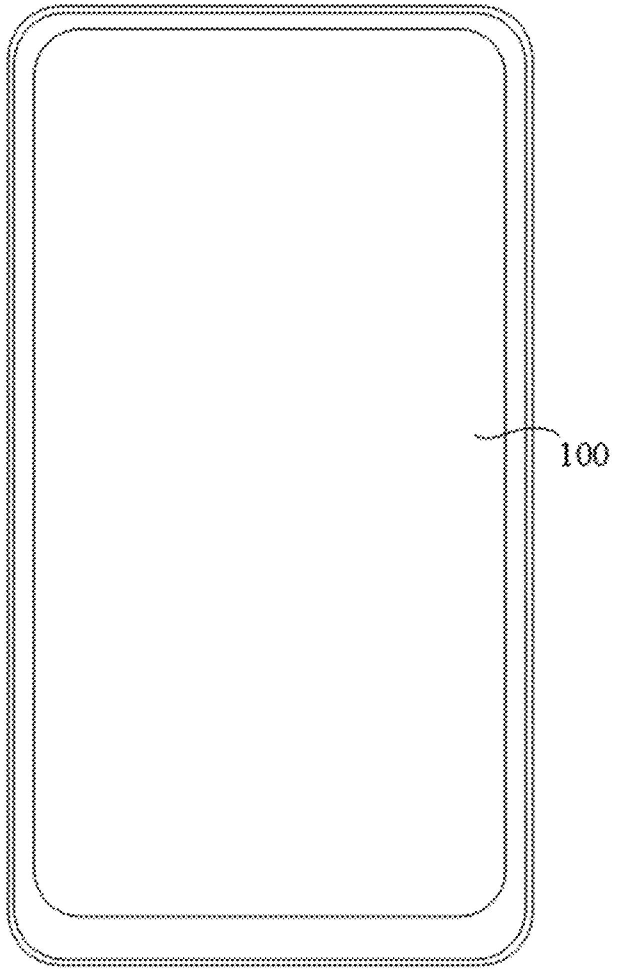
FIG. 16 is a schematic diagram of a display device according to an embodiment of the present disclosure.

An embodiment of the present disclosure further provides a display device, as shown in FIG. 16, which is a schematic diagram of a display device including the above display module 100 according to an embodiment of the present disclosure. The specific structure of the display module 100 has been described in detail in the above embodiments, and details are not described herein again. It should be understood that, the display device shown in FIG. 16 is merely illustrative, and the display device can be any electronic device having a display function such as a mobile phone, a tablet computer, a notebook computer, an electronic paper book, a vehicle-mounted display screen, or a television.

In the display device provided by the embodiments of the present disclosure, the second pixel row 12 in the display panel is electrically connected to the driver chip 20, so that the number of the gate driving units 150 can be reduced or such units can even be completely eliminated from the third non-display region NA3, thereby reducing the frame width of the third non-display region NA3, reducing the width difference between the third non-display region NA3 and the second non-display region NA2, for example, the width of the third non-display region NA3 can be equal to the width of the second non-display region NA2, and thus improving the visual effect of the display panel.

It should be noted that embodiments of the present disclosure and features in the embodiments may be combined with each other without conflict.

The above description is only preferred embodiments of the present disclosure and is not intended to limit the present disclosure, and any modifications, equivalent substitutions, improvements and the like made within the spirit and principle of the present disclosure should be included within the protection scope of the present disclosure.

What is claimed is:

1. A display module, comprising:

a display panel, comprising a display region and a non-display region, wherein the non-display region comprises a first non-display region, a second non-display region and a third non-display region; the first non-display region and the display region are arranged along a first direction, the second non-display region and the display region are arranged along a second direction, and the first direction intersects with the second direction; the third non-display region is located between the first non-display region and the second non-display region, and the third non-display region is provided corresponding to a corner of the display region;

wherein the display region comprises a plurality of first pixel rows and a plurality of second pixel rows, the plurality of first pixel rows and the plurality of second pixel rows are arranged along the second direction, and the plurality of second pixel rows are located on a side of the plurality of first pixel rows proximate the second non-display region;

wherein the first non-display region comprises a gate driving circuit, and the plurality of first pixel rows are electrically connected to the gate driving circuit through a first gate driving signal line; and wherein the non-display region comprises a driver chip, and the plurality of second pixel rows are electrically connected to the driver chip through a second gate driving signal line.

2. The display module according to claim 1, wherein at least a portion of the second gate driving signal line is located in the display region.

3. The display module according to claim 2, wherein the display region further comprises a plurality of data lines, the plurality of data lines comprises a first data line, and an extension line of the first data line passes through the third non-display region; and the display panel further comprises a data connection line electrically connected to the first data line, and at least a portion of the data connection line is located in the display region.

4. The display module according to claim 3, wherein the data connection line comprises a first data connection sub-line extending along the first direction and a second data connection sub-line extending along the second direction; and the second gate driving signal line comprises a first gate driving signal sub-line at least partially located in the display region, an extension line of the first gate driving signal sub-line does not pass through the third non-display region, and the first gate driving signal sub-line and the second data connection sub-line are provided in a same layer.

5. The display module according to claim 1, wherein at least a portion of the second gate driving signal line is located in the non-display region.

6. The display module according to claim 5, wherein the second gate driving signal line comprises a first connection sub-line, a second connection sub-line, and a third connection sub-line electrically connected to each other, and an extending direction of the first connection sub-line, an extending direction of the second connection sub-line and an extending direction of the third connection sub-line intersect with each other;

the third non-display region comprises at least a portion of the first connection sub-line; and an included angle between the second direction and the extending direction of the first connection sub-line is less than or equal to 45°.

7. The display module according to claim 5, wherein two adjacent second gate driving signal lines are located in different film layers.

8. The display module according to claim 1, wherein the third non-display region comprises an electrostatic discharge protection circuit.

9. The display module according to claim 8, wherein at least a portion of the second gate driving signal line is located in the third non-display region; and at least a portion of the electrostatic discharge protection circuit is located on a side of the second gate driving signal line away from the display region.

10. The display module according to claim 8, wherein the gate driving circuit comprises a plurality of cascaded gate driving units;

the display panel further comprises a gate driving input signal line electrically connected to the gate driving units; and the electrostatic discharge protection circuit is electrically connected to the driver chip and the gate driving input signal line.

11. The display module according to claim 10, wherein the third non-display region further comprises a first electrostatic discharge protection connection line electrically connected to the driver chip and the electrostatic discharge protection circuit.

12. The display module according to claim 11, wherein at least a portion of the second gate driving signal line is located in the third non-display region; and at least a portion of the first electrostatic discharge protection connection line is located on a side of the second gate driving signal line away from the display region.

13. The display module according to claim 8, wherein the third non-display region comprises a first power connection line electrically connected to the plurality of first pixel rows and the plurality of second pixel rows; and the first power connection line is located on a side of the electrostatic discharge protection circuit away from the display region.

14. The display module according to claim 1, wherein a number n of the plurality of second pixel rows satisfies: $3 \leq n \leq 10$.

15. The display module according to claim 1, wherein an edge of the third non-display region away from the display region comprises an arc.

16. The display module according to claim 1, wherein the display panel further comprises a bent portion located on a side of the driver chip close to the display region; and the driver chip is bent to a side of the display panel away from a light-emitting side through the bent portion.

17. A display device, comprising a display module;

wherein the display module comprises:

a display panel, comprising a display region and a non-display region, wherein the non-display region comprises a first non-display region, a second non-display region and a third non-display region; the first non-display region and the display region are arranged along a first direction, the second non-display region and the display region are arranged along a second direction, and the first direction intersects with the second direction; the third non-display region is located between the first non-display region and the second non-display region, and the third non-display region is provided corresponding to a corner of the display region;

wherein the display region comprises a plurality of first pixel rows and a plurality of second pixel rows, the plurality of first pixel rows and the plurality of second pixel rows are arranged along the second direction, and the plurality of second pixel rows are located on a side of the plurality of first pixel rows proximate the second non-display region;

wherein the first non-display region comprises a gate driving circuit, and the plurality of first pixel rows are electrically connected to the gate driving circuit through a first gate driving signal line; and wherein the non-display region comprises a driver chip, and the plurality of second pixel rows are electrically connected to the driver chip through a second gate driving signal line.

* * * * *